United States Patent [19]

Valdes

[11] 3,714,578

[45] Jan. 30, 1973

[54] ELECTRONIC VOLUME AND ON/OFF CIRCUITS FOR REMOTE CONTROL SYSTEMS

[75] Inventor: Silverio Antonio Valdes, Alexander, N.Y.

[73] Assignee: GTE Sylvania Incorporated

[22] Filed: June 3, 1971

[21] Appl. No.: 149,709

[52] U.S. Cl. ..................325/319, 325/391, 325/392, 325/393, 325/401, 325/411, 325/413, 325/457

[51] Int. Cl. ..............................................H04b 1/16

[58] Field of Search......325/319, 391, 393, 401, 408, 325/411, 413, 457, 409, 392

[56] References Cited

UNITED STATES PATENTS

| | | | |
|---|---|---|---|
| 3,537,012 | 10/1970 | Reicard et al. | 325/391 |
| 3,304,502 | 2/1967 | Paddock | 325/391 |

OTHER PUBLICATIONS

FIG. 1 of Applicant's Application

*Primary Examiner*—Albert J. Mayer
*Attorney*—Norman J. O'Malley, Robert E. Walrath and Thomas H. Buffton

[57] ABSTRACT

A remotely operable all electronic volume and on/off control circuit for a signal receiver having a sound channel responsive to variations in an alterable impedance includes an insulated-gate FET-type (IGFET) semiconductor and adjustable impedance series connected intermediate the sound channel and a potential reference level, an on-off relay coupled to the adjustable impedance for effecting energization of the signal receiver, a memory means coupled to the semiconductor, and a single relay up-down volume control means coupled to the memory means and responsive to signals at two different frequencies for effecting increased and decreased audio volume from the sound channel and for effecting operation and discontinuance of operation of the signal receiver.

10 Claims, 4 Drawing Figures

INVENTOR.
SILVERIO ANTONIO VALDEZ

BY Robert E. Walrath

ATTORNEY

ELECTRONIC VOLUME AND ON/OFF CIRCUITS FOR REMOTE CONTROL SYSTEMS

BACKGROUND OF THE INVENTION

In a signal receiver and especially the television signal receiver art it has become a common practice to employ an integrated circuit type structure for the sound channel of the receiver. For example, prior art FIG. 1 illustrates an IC sound chip manufactured by RCA and bearing the designation CA3065. In this example there is included an IF amplifier-limiter, FM detector, electronic attenuator, and audio drive circuit. However, numerous other sources provide similar IC chip circuitry.

Further, the IC chip includes an electronic attenuator having an external connection (Pin 6) whereat is provided a potential which is coupled by way of an alterable impedance (R*x* of FIG. 1) to a potential reference level such as circuit ground. Varying the alterable impedance, in the range of about 4K to 30K-ohms in this instance, provides a variation in audio volume of about 60 db as illustrated in the prior art graph of FIG. 2. Thus, varying the impedance intermediate the electronic attenuator (Pin 6) of the IC chip and a potential reference level provides a variation in volume available from the sound channel.

As to remote control systems for signal receivers, one known technique for controlling the volume of the sound channel includes the utilization of bi-directional motors. Therein, the volume of the sound channel is increased by activation of a motor in one direction in response to a signal of one particular frequency and decreased by activation of the motor in an opposite direction in response to a signal of a different frequency. The on-off control of the receiver requires additional signals and controls.

In other known remote control systems, a MOSFET-type semiconductor is coupled intermediate the sound chip and a potential reference level, a memory capacitor is coupled to the MOSFET, and potentials developed in response to signals at two different frequencies are applied to neon lamps coupled to the memory capacitor. Thus, a charge developed in response to one of two signals causes firing of a neon lamp, charging of a memory capacitor, alteration of current flow through a semiconductor, and variation in the volume available from the sound chip of a signal receiver. Upon discontinuance of the signal, the neon lamp is rendered non-conductive whereupon the charge of the memory capacitor is theoretically maintained, the bias applied to the semiconductor is maintained, and the volume available from the receiver remains substantially uniform. Such a system is set forth in an article entitled "Motorless Remote Control For Color TV" appearing in Vol. 8, No. 1 of the Signalite Application News, a division of General Instrument or the book "The Two Thousand Technical Manual" courtesy of RCA Sales Corporation.

Although such techniques have been and still are widely employed in present day signal receivers, it has been found that such circuitry does leave something to be desired. For example, known signal receivers employing the above-described remote volume control system require an additional channel to effect on-off operation of the receiver. Also, neon-lamp type circuitry is susceptible to long term leakage of the memory condenser charge which is a most undesirable condition due to the resultant audio volume change of the receiver. Moreover, it is highly desirable to provide some form of muting during channel selection such that unpleasant noises are eliminated or at least reduced during such channel selection.

OBJECTS AND SUMMARY OF THE INVENTION

Therefore, it is an object of the present invention to provide an enhanced remote control system for a signal receiver. Another object of the invention is to provide an improved on-off and volume control remote system for a signal receiver. Still another object of the invention is to provide a single relay remotely operable volume and on-off control system for a signal receiver. A further object of the invention is to provide an improved up-down volume control and on-off switching means responsive to a single relay operable by a pair of signals having different frequencies.

These and other objects, advantages and capabilities are achieved in one aspect of the invention by a remotely controllable volume and on-off system wherein a signal at one of two frequencies causes operation of a relay, application of a charging potential to a memory capacitor altering the bias on and current flow through an FET-type semiconductor to vary the volume of a receiver, and activation of a relay to couple a power source to the receiver. A signal at the other frequency operates the relay, provides a discharge path for the charge on the memory capacitor altering the bias on and current flow through the FET-type semiconductor to reduce the volume of the receiver, and activates a relay to decouple the power source from the receiver.

DESCRIPTION OF A PREFERRED EMBODIMENT

For a better understanding of the present invention, together with other and further objects, advantages and capabilities thereof, reference is made to the following disclosure and appended claims in connection with the accompanying drawings.

Figures 1, 2:
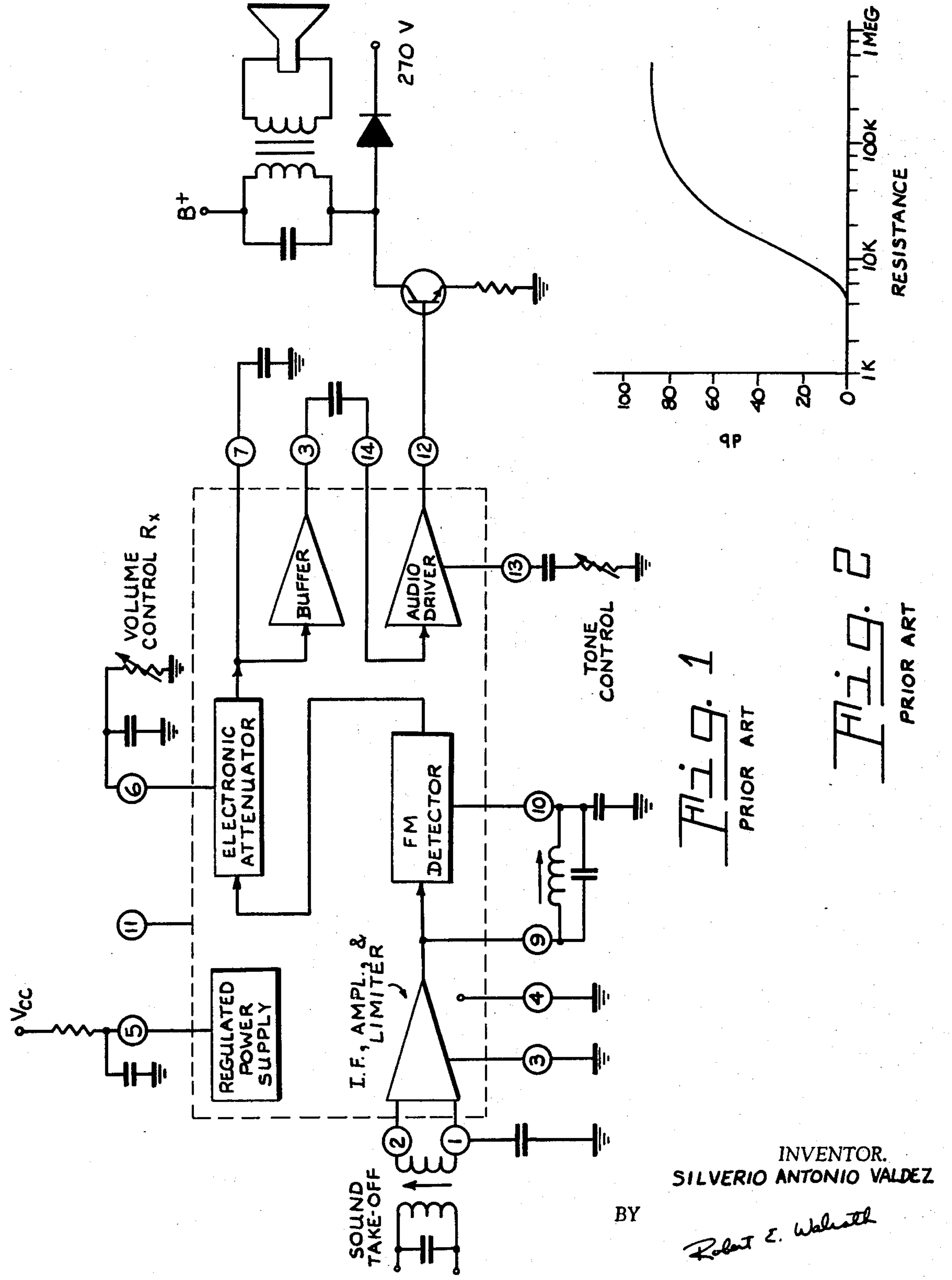
FIG. 1 PRIOR ART, FIG. 2 PRIOR ART
FIG. 1 is an illustration of a prior art type of IC chip used in the sound channel of a signal receiver.
FIG. 2 is a chart illustrating the operational characteristics of the prior art structure of FIG. 1.

Referring to the drawings, the prior art illustration of FIG. 1 sets forth a sound channel which includes an integrated circuit chip. The circuit chip has an external connection (Pin 6) whereat a potential appears and whereat provision is made for attachment of an adjustable impedance (R*x*). This adjustable impedance (R*x*) is also connected to a potential reference level such as circuit ground and variations of the adjustable impedance (R*x*) serve to effect variations in the audio volume available from the IC chip.

Preferably, the IC chip illustrated by the prior art FIG. 1 has an adjustable impedance (R*x*) which varies in the range of about 4 to 30K-ohms. In turn, the audio volume is varied in the range of about 60 db as illustrated in the prior art FIG. 2. Thus, a system whereby a 4–30K ohm variation is attained will provide a desired 60 db change in audio volume.

Figure 3:
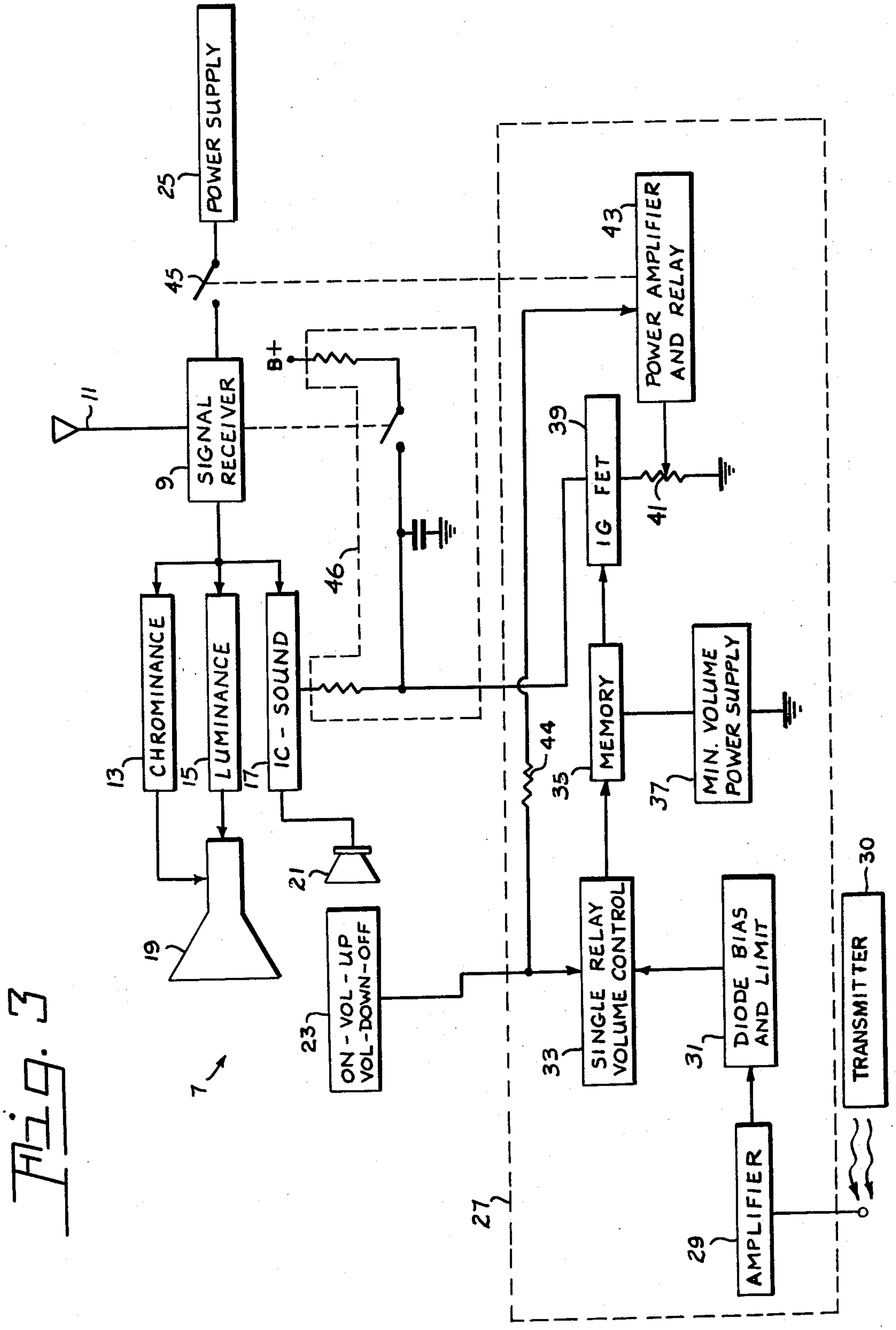
FIG. 3 is a diagram, in block form, illustrating a preferred embodiment of a remotely operable volume and on-off control system of the present invention.

As to a specific form of volume and on-off remote control system, reference is made to the block diagram of FIG. 3. Therein, a television receiver 7 includes the usual signal receiver 9 coupled to an antenna 11 and providing signals for a chrominance channel 13, a luminance channel 15, and a sound channel 17. The luminance and chrominance channels 13 and 15 are coupled to a picture tube 19 while the sound channel 17 is coupled to a loud-speaker 21. The receiver 7 also includes a manually operable on-off-volume up-down switching means 23 for coupling a power supply 25 to the receiver 7.

Remote control circuitry 27 includes an amplifier stage 29 responsive to a pair of signals available from a remotely located transmitter 30 and having differing frequencies such as 35.25 kHz. and 35.75 kHz. for example. This amplifier stage 29 is coupled by a diode-biased and limited amplifier 31 to a single relay on-off-volume control circuit 33. A memory circuit 35 having a negative limiting means and coupled to a potential reference level by a minimum volume determining power supply 37 couples the single relay volume control circuit 33 to an IGFET-type semiconductor 39.

The IGFET-type semiconductor 39 is connected in series with an adjustable resistor 41 intermediate the sound channel 17 of the receiver 7 and a potential reference level such as circuit ground. The adjustable resistor 41 has an alterable arm which is coupled to a power amplifier and relay stage 43. The relay of the power amplifier and relay stage 43 has a contactor 45 for effecting application of potentials from the power supply 25 to the receiver 7. Also, a muting circuit 46 is coupled intermediate the series connected sound channel 17 and semiconductor 39 and a potential source B+. Moreover, the manual on-off switching means 23 is coupled to the single relay on-off-volume control circuit 33 which is also shunt coupled by an impedance 44 to the power amplifier and relay stage 43.

Generally, a transmitted signal at one of a pair of frequencies is applied to the amplifier stage 29 wherein the signal is intensified and applied to the diode biased and limited amplifier 31. Therein, the signal magnitude is amplified and limited to enhance the signal-to-noise ratio and applied to the single relay on-off-volume control circuit 33.

Assuming the transmitted signal is of a frequency which has previously been determined as the signal for affecting an increase in volume, the signal applied to the single relay volume control circuit 33 will be bypassed around the memory circuit 35 and IGFET-type semiconductor 39 via the impedance 44 to the power amplifier relay circuit 43. Therein, the relay will be energized causing activation of the contact 45 coupling the power source 25 to the receiver 7. Thus, the activated receiver 7 will provide a potential at pin 6 of FIG. 1 of the sound chip 17 whereto is coupled the IGFET semiconductor 39.

Also, the single relay volume control circuit 33 will respond to the applied signal to affect application of a potential to the memory circuit 35. The memory circuit 35 will build up a charge, in accordance with the applied potential and duration of the signal causing an alteration in bias applied to the IGFET-type semiconductor 39. Thereupon, current conduction through the IGFET circuit 39 will be increased reducing the resistance disposed intermediate the sound channel 17 and the potential reference level or circuit ground. Thus, a signal at a given frequency provided by a remote unit effects activation of the receiver 7 and a desired increase in audio volume. Also, the current through the IGFET (39) serves to maintain activation of the power amplifier and relay 43 whereupon the receiver 7 remains energized.

Further, application of a signal at a different frequency which had previously been determined as the signal for effecting a reduction in audio volume and for deactivating the receiver 7 will be amplified by the amplifier stage 29 and again amplified and noise limited by the diode biased and limited amplifier 31. The noise limited signal causes activation of the single relay volume control circuit 33 to provide a discharge path for the memory circuit 35.

Discharge of the memory circuit 35 reduces the bias potential applied to the IGFET-type semiconductor 39 whereupon the current flow therethrough is reduced and the resistance intermediate the sound channel 17 and circuit ground is increased. Thus, the increased resistance intermediate the sound channel 17 and circuit ground provides the desired decrease in audio volume available from the sound channel 17.

Moreover, when the current flow through the IGFET-type semiconductor and series connected adjustable resistor 41 reaches a predetermined level as selected by the alterable arm of the adjustable resistor 41, the potential applied to the power amplifier and relay stage 43 is reduced. Thereupon, the relay is deactivated and contact 45 operated to effect a discontinuance in power applied to the receiver 7 from the power supply 25. Thus, the same signal is utilized to reduce the audio volume and to deactivate or turn-off the receiver 7.

Additionally, activation of the channel selector (not shown) in the tuner portion of the signal receiver 9 to effect a change in channel selection serves to activate the muting circuit 46. Thereupon, a potential from the potential source B+ is applied to the sound channel 17 whereupon the audio volume available therefrom is reduced. Moreover, the applied potential serves to maintain current flow through the series connected IGFET and alterable resistor 41 whereupon the power amplifier and relay 43 remain energized which maintains the receiver 7 operational.

Figure 4:
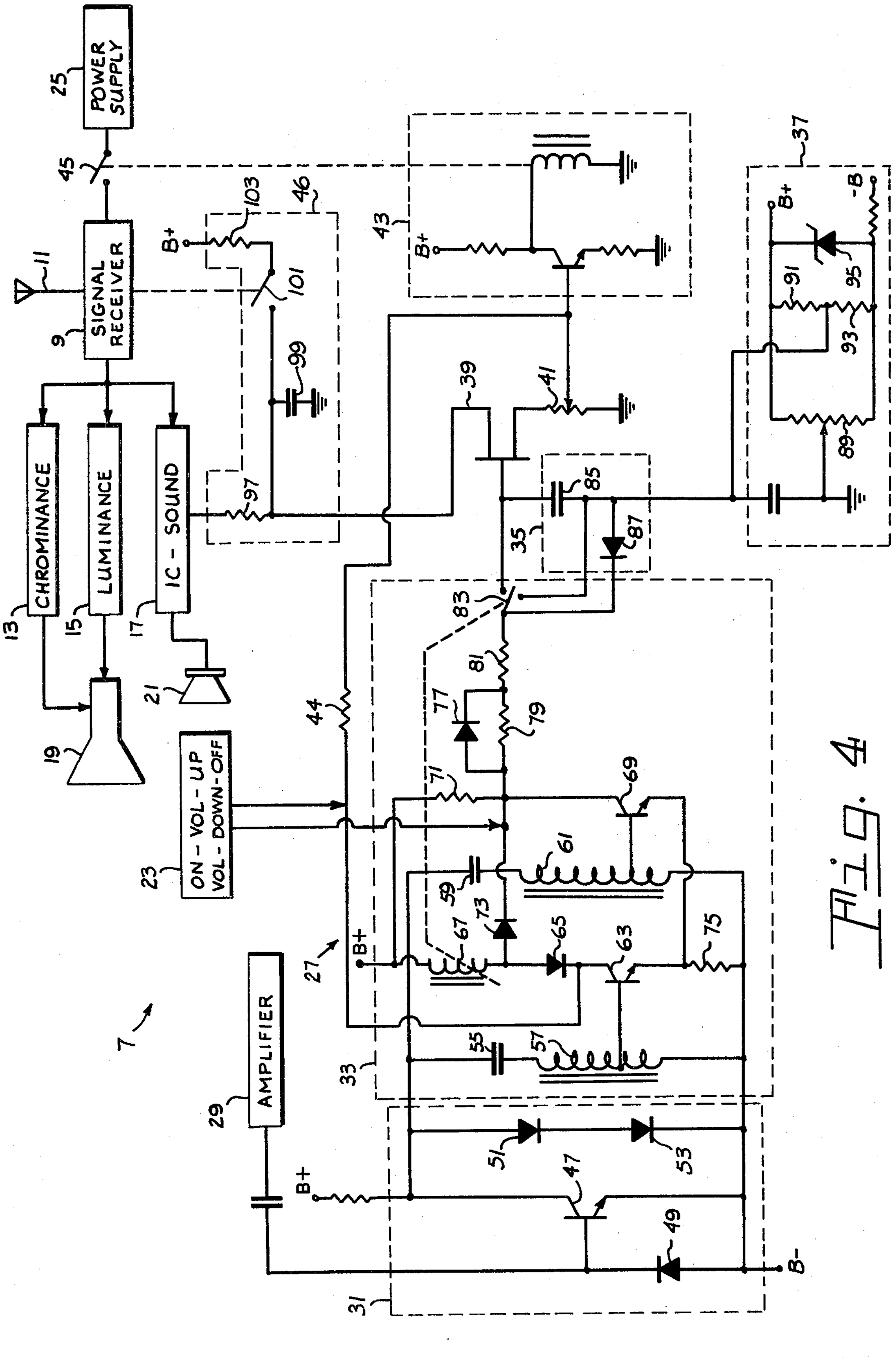
FIG. 4 is a diagram, in block and schematic form, of the embodiment of FIG. 3.

More specifically, the block and schematic illustration of FIG. 4 utilizes numbers representing the same circuitry as FIG. 3, and includes the signal receiver 7 as provided in FIG. 3. Also, the remote control circuitry 27 includes a schematic illustration of the diode bias and limiter circuit 31, the single relay volume control circuit 33, the negative-limited memory circuit 35, the minimum volume power supply 37, and the power amplifier and relay stage 43.

The diode bias and limiter circuit 31 includes a transistor 47 having an emitter coupled to a potential reference level and a base coupled to the amplifier stage 29 and via a bias-developing diode 49 to a potential reference level. The collector is coupled to a potential source B+ and to circuit ground via series connected diodes 51 and 53, and to a detector circuit in the form of the single relay volume control circuit 33.

In operation, the bias-developing diode 49 provides a low resistance path in the base circuit of the transistor 47 whereupon the gain of the stage is enhanced. Also, the input resistance of the detector circuit or single relay volume control circuit 33 is preferably low to avoid loss of selectivity and commonly employs a step-down transformer to effect an impedance reduction. However, the series connected diodes 51 and 53 provide the desired low resistance and, in addition, serve to limit the magnitude of the applied signals to a value of about 1.4 volts in this instance, whereby noise immunity is improved.

The single relay volume control circuit 33 includes a first frequency responsive series tuned circuit having a capacitor 55 and an inductor 57 and a second frequency responsive series tuned circuit having a capacitor 59 and an inductor 61. These first and second series tuned circuits are coupled in parallel intermediate the output circuitry of the diode bias and limiter circuit 31 and a potential reference B–. A first transistor 63 has a base electrode coupled to the inductor 57 of the first tuned circuit and a collector coupled via a series connected diode 65 and relay coil 67 to a potential source B+. A second transistor 69 has a base electrode connected to the inductor 61 of the second tuned circuit and a collector coupled via an impedance 71 to the potential source B+ and via a diode 73 to the junction of the series connected diode 65 and relay coil 67 in the collector of the first transistor 63. An impedance 75 couples the emitters of the first and second transistors 63 and 69 to the potential reference B–.

Further, the junction of the series connected diode 65 and collector circuit of the first transistor 63 is also coupled to the manual on-off-volume switching means 23 of the receiver 7 and via the impedance 44 to the power amplifier and relay stage 43. The collector of the second transistor 69 is directly coupled to the on-off switching means 23 and by the impedance 44 to the power amplifier and relay stage 43. Also, the collector of the second transistor 69 is coupled by parallel connected diode 77 and resistor 79 in series connection with a resistor 81 and contacts 83 of the relay coil 67 to the memory circuit 35 and to the IGFET-type semiconductor 39.

In operation, a received signal, 35.25 kHz. for example, for increasing the receiver volume will be applied to the first frequency responsive circuit which includes capacitor 55 and tuned inductor 57 to effect conduction of the first transistor 63. Thereupon, current will flow through the first transistor 63, diode 65, and relay coil 67 to effect operation of the relay contactor 83. As a result, the memory circuit 35 will be charged via a path from the potential source B+ through a resistor 71, a diode 77, a resistor 81, and the contactor 83. An increase in charge of the memory circuit 35 increases the bias on the IGFET-type semiconductor 39 which increases current conduction therethrough and provides a decreased resistance intermediate the sound channel 17 and circuit ground. Thus, audio volume is increased.

Assuming the receiver were in an inoperative condition when the signal is applied, the sound channel 17 would be inactive and there would be no existant potential applied to the IGFET-type semiconductor 39. However, shunting the applied signal around the IGFET semiconductor 39 via the impedance 44 to the power amplifier and relay stage 43 causes activation of the relay contacts 45 of the receiver 7 and coupling of the power supply 25 thereto. Thus, a potential is made available in the sound channel 17 for the IGFET semiconductor circuit 39 and the previously mentioned increased charge of the memory capacitor 35 provides the desired increased audio volume. Also, current flow through the IGFET keeps the power amplifier and relay stage 43 energized whereupon the receiver 7 remains activated.

On the other hand, a received signal, 35.75 kHz. for decreasing the audio volume of the receiver 7 will appear at the second frequency responsive circuit i.e., capacitor 59 and inductor 61 to cause conduction of the second transistor 69. Thereupon, the current will flow through the diode 73 and relay coil 67 to effect closure of the relay contact 83. The charged memory capacitor circuit 35 will discharge via the resistors 81 and 79, the transistor 69 and resistor 75 to the reference potential B–.

As the memory circuit 35 discharges, at a derived rate determined by the differing charge and discharge paths as provided by the parallel coupled diode 77 and resistor 79, the bias applied to the IGFET-type semiconductor 39 is reduced, current flow through the IGFET 39 is reduced, and the resistance intermediate the sound channel 17 and circuit ground increases whereby audio volume of the receiver 7 is reduced. Moreover, reduction in current flow through the IGFET-type semiconductor circuit 39 reduces the current flow through the series connected adjustable resistor 41. In turn, the relay of the power amplifier and relay stage 43 is de-activated which disconnects the power supply 25 from the receiver 7 via the contacts 45.

Additionally, the memory circuit 35 includes a storage capacitor 85 shunted by a diode 87 when contactor 83 is in the operable position. The memory circuit 35 is coupled intermediate the relay contact 83 and the IGFET-type semiconductor 39. Thus, the relay contact 83, which theoretically has infinite impedance when opened, and the IGFET-type semiconductor 39, which theoretically has a gate resistance approaching infinity, serve to provide a system less susceptible to change in volume due to long term leakage of the memory condenser 85. This desired uniformity of volume is further enhanced by coupling the contact 83 directly to the capacitor 85 when the receiver 7 is inoperative. Thus, any leakage through the normally open contact 83 will be applied to the capacitor 85 to effect discharge rather than charging thereof when the receiver 7 is inoperative. As a result, the memory condenser 85 is completely discharged when the receiver is inoperative whereby long term potential leakage is not a problem.

The shunting diode 87 serves to receiver 7 limit the negative charge which may be accumulated on the memory capacitor 85. Should the "down" button remain active after the receiver has been turned off, a negative charge would tend to build up on the capacitor 85. Thus, this undesired negative charge would have to be overcome when activation of the receiver 7c is resumed and such a task requires time which gives an operator the impression that trouble exists. However, the shunting diode 87 prohibits such an overcharge condition by short-circuiting the capacitor 85 when the potential reaches a circuit ground value.

Further, the minimum volume level of the receiver 7 is determined by a fixed bias potential applied to the IGFET-type semiconductor 39. This fixed bias potential is dependent upon the minimum volume power supply 37 which includes a bridge circuit having an alterable resistor 89 shunted by a pair of series connected fixed resistors 91 and 93. A zener diode 95 shunts the series connected fixed resistors 91 and 93 and is coupled intermediate a pair of voltage source B+ and B−. A center tap for the fixed resistors 91 and 93 determines circuit ground and the adjustable arm of the alterable resistor 89 provides a desired plus or minus fixed bias for the source circuit of the IGFET 39 whereby zero volume and zero potential on the memory capacitor 85 is attained when the receiver 7 is turned off.

Additionally, the muting circuit 46 includes a first impedance 97 coupling the IC sound channel 17 to the IGFET semiconductor 39. The junction of the first impedance 97 and the IGFET semiconductor 39 is coupled via a capacitor 99 to circuit ground and by way of a series connected contact arm 101 and second impedance 103 to a potential source B+.

Upon closure of the contact arm 101 when channel selection of the signal receiver 9 is desired, a potential from the potential source B+ is applied to the sound channel 17. Thereupon, the audio volume available from the sound channel 17 is reduced and undesired noise normally heard when signal channels are being selected is reduced. Also, the added potential provided by the potential source B+ tends to maintain current flow through the IGFET semiconductor 39 and the alterable resistor 41. Thus, the power amplifier and relay 43 remains energized which, in turn, maintains the receiver 7 energized by maintaining the coupling of the power supply 23 to the signal receiver 9.

Thus, there has been provided a unique remotely operable volume and on-off control system wherein one pair of frequency channels serves to provide both receiver activation and volume increase as well as volume decrease and receiver de-activation. The system includes numerous desirable features such as diode biasing and limiting for enhanced signal amplification and noise suppression.

Also, a relatively inexpensive and uncomplicated single relay up-down volume control circuit permits enhanced volume stability due to inhibited long term leakage of a memory condenser while the memory condenser per se is negative charge limited which enhances operation of the system. Moreover, a regulated power supply provides a desired fixed bias level insuring a zero volume setting and zero potential on the memory capacitor when the receiver is turned off while a sensity control is provided for activation and de-activation of the receiver.

While there has been shown and described what is at present considered the preferred embodiment of the invention, it will be obvious to those skilled in the art that various changes and modifications may be made therein without departing from the invention as defined by the appended claims.

I claim:

1. In a signal receiver having a sound channel formed to provide audio volume variations in response to variations in an alterable impedance coupled intermediate thereto and a potential reference level, a remotely operable volume and on-off control system comprising:

- an insulated gate FET-type semiconductor and adjustable impedance series connected intermediate said sound channel and a potential reference level;
- on-off relay means coupled to said adjustable impedance for effecting coupling and decoupling of said signal receiver and a power source;
- memory means and power supply means series coupled to said semiconductor and to a potential reference level;
- single relay up-down volume control means coupled to said memory means and to said on-off relay means, and responsive to a pair of signals at different frequencies to effect operation and increased audio volume and decreased audio volume and inoperation respectively of a signal receiver.

2. The system of claim 1 wherein said memory means is in the form of a capacitor and includes a negative charge limiting means in the form of a diode shunting said capacitor whereby negative potential developed at said memory means is limited by said diode.

3. The system of claim 1 wherein said power supply means includes a bridge circuit for effecting a fixed bias potential for said semiconductor whereby zero volume is assured at the receiver de-activation point.

4. The system of claim 1 wherein said on-off relay means includes amplifier means responsive to said adjustable impedance to effect a threshold setting for said on-off relay.

5. The system of claim 1 wherein said up-down volume control means includes a single relay responsive to current flow through each one of a pair of electron devices, each of said pair of electron devices being responsive to a signal at one of two frequencies.

6. The system of claim 1 including a signal amplifier stage and a diode limiting means coupling the amplifier stage to said single relay up-down volume control means.

7. The system of claim 1 including manual switching means for effecting application of a potential to said single relay up-down volume control means and to said on-off relay means to cause energization of said receiver and effect increased and decreased volume and de-activation of said receiver.

8. A remotely operable volume and on-off control system for a television receiver having a sound channel responsive to variations in an alterable impedance comprising:

- a signal transmitter providing a pair of signals having different frequencies;
- single relay up-down volume control means responsive to said signal transmitter for providing output signals of opposite polarity in response to each of said signals at different frequencies;
- memory means coupled via a power supply to a potential reference level and to said single relay up-down volume control means;

IGFET-type semiconductor means coupled to said memory means and series connected to an alterable resistor intermediate said sound channel and a potential reference level; and on-off relay means coupled to said alterable resistor and responsive to variation in the impedance thereof to effect coupling and decoupling of a power source and said receiver.

9. The control system of claim 8 including an amplifier means responsive to signals from said signal transmitter and having a diode limiter means for applying signals to said single relay up-down volume control means.

10. The control system of claim 8 wherein said single relay up-down volume control means includes a pair of electron devices each responsive to a signal having a different frequency to effect activation of said relay.

* * * * *